United States Patent
Block et al.

(10) Patent No.: US 6,887,448 B2
(45) Date of Patent: May 3, 2005

(54) METHOD FOR PRODUCTION OF HIGH PURITY SILICON

(75) Inventors: Hans-Dieter Block, Leverkusen (DE); Leslaw Mleczko, Bochum (DE); Hans-Joachim Leimkühler, Leverkusen (DE); Rainer Weber, Odenthal (DE); Knud Werner, Krefeld (DE); Dietmar Schwanke, Monheim (DE); Johannes-Peter Schäfer, Kürten (DE); Gebhard Wagner, Odenthal (DE)

(73) Assignee: SolarWorld AG, Bonn (DE)

( * ) Notice: Subject to any disclaimer, the term of this patent is extended or adjusted under 35 U.S.C. 154(b) by 0 days.

(21) Appl. No.: 10/450,125

(22) PCT Filed: Nov. 21, 2001

(86) PCT No.: PCT/EP01/13507

§ 371 (c)(1),
(2), (4) Date: Oct. 2, 2003

(87) PCT Pub. No.: WO02/48034

PCT Pub. Date: Jun. 20, 2002

(65) Prior Publication Data

US 2004/0047797 A1 Mar. 11, 2004

(30) Foreign Application Priority Data

Dec. 11, 2000 (DE) .......................................... 100 61 682

(51) Int. Cl.$^7$ ............................................. C01B 33/02
(52) U.S. Cl. ....................................... 423/349; 423/348
(58) Field of Search .......................... 423/89, 324, 348, 423/349, 350

(56) References Cited

U.S. PATENT DOCUMENTS

| | | | |
|---|---|---|---|
| 3,012,861 A | | 12/1961 | Ling |
| 4,113,845 A | * | 9/1978 | Litteral ........................ 423/342 |
| 4,117,094 A | * | 9/1978 | Blocher et al. ............. 423/342 |
| 4,340,574 A | | 7/1982 | Coleman |
| 4,454,104 A | * | 6/1984 | Griesshammer et al. .... 423/349 |
| 4,519,999 A | | 5/1985 | Coleman et al. |
| 4,676,967 A | | 6/1987 | Breneman |
| 4,690,810 A | | 9/1987 | Breneman et al. |
| 5,798,137 A | | 8/1998 | Lord et al. |
| 6,368,568 B1 | * | 4/2002 | Lord .......................... 423/350 |

FOREIGN PATENT DOCUMENTS

| | | |
|---|---|---|
| DE | 2 161 641 | 6/1973 |
| DE | 25 07 864 | 8/1975 |
| DE | 26 23 290 A1 | 12/1977 |
| DE | 1583 22 | 1/1983 |
| DE | 37 09 577 A1 | 10/1987 |
| DE | 33 11 650 C2 | 11/1987 |
| DE | 41 04 422 A1 | 8/1992 |
| JP | 56073617 | 6/1981 |

OTHER PUBLICATIONS

Øye et al., Jun. 3–5, 1998, *Silicon for the Chemical Industry IV*, Norwegian University of Science and Technology 7034 Trandheim, Norway.

Lewis et al., 1993, *Catalyzed Direct Reactions of Silicon*, Studies in Organic Chemistry 49.

Gerhartz et al., 1988, *Mixing of Solids*, Ullmann's Encyclopedia of Industrial Chemistry, $5^{th}$ Completely Revised Edition, vol. B 2: Unit Operations I, p. 27–1 to 27–16.

* cited by examiner

*Primary Examiner*—Steven Bos
*Assistant Examiner*—Colleen P. Cooke
(74) *Attorney, Agent, or Firm*—McGlew and Tuttle, P.C.

(57) ABSTRACT

The invention relates to a method for the production of high purity silicon, characterized by the following steps: a) reaction of metallic silicon with silicon tetrachloride ($SiCl_4$), hydrogen ($H_2$) and hydrochloric acid (HCl) at a temperature of 500 to 800° C. and a pressure of 25 to 40 bar to give a trichlorosilane-containing ($SiHCl_3$) feed gas stream, b) removal of impurities from the resultant trichlorosilane-containing feed gas stream by scrubbing with condensed chlorosilanes at a pressure of 25 to 40 bar and a temperature of 160 to 200° C. in a multi-stage distillation column, to give a purified trichlorosilane-containing feed gas stream and a solid-containing chlorosilane suspension and a distillative separation of the purified feed gas stream into a partial stream essentially comprising $SiCl_4$ and a partial stream, essentially comprising $SiHCl_3$, c) disproportionation of the $SiHCl_3$-containing partial stream to give $SiCl_4$ and $SiH_4$, whereby the disproportionation is carried out in several reactive/distillative reaction zones, with a counter-current of vapour and liquid, on catalytic solids at a pressure of 500 mbar to 50 bar and $SiHCl_3$ is introduced into a first reaction zone, the lower boiling $SiH_4$-containing disproportionation product produced there undergoes an intermediate condensation in a temperature range of –25° C. to 50° C., the non-condensing $SiH_4$-containing product mixture is fed to one or more further reactive/distillative reaction zones and the lower boiling product thus generated, containing a high proportion of $SiH_4$ is completely or partially condensed in the head condenser and d) thermal decomposition of the $SiH_4$ to give high purity silicon.

23 Claims, No Drawings ns: METHOD FOR PRODUCTION OF HIGH PURITY SILICON

The present invention relates to a method for producing high-purity silicon by reaction of metallic silicon with silicon tetrachloride ($SiCl_4$), hydrogen ($H_2$), and hydrochloric acid (HCl), removal of impurities from the resultant trichlorosilane-containing ($SiHCl_3$) feed gas stream, disproportionation of $SiHCl_3$ to give $SiCl_4$ and silane ($SiH_4$), and thermal decomposition of the $SiH_4$ to give high-purity silicon.

High-purity silicon is needed in the production of semiconductors and solar cells. In this context, the required purity level of the silicon is very high. The production of high-purity silicon meeting these requirements is performed in accordance with "Silicon for the Chemical Industry IV, Geiranger, Norway, Jun. 3–5, 1998, Ed.: H. A. Øye, H. M. Rong, L. Nygaard, G. Schüssler, J. Kr. Tuset, pp. 93–112" following three different methods:

reaction of metallic silicon with hydrochloric acid (HCl) in a fluid bed to give $SiHCl_3$, purification of $SiHCl_3$, thermal decomposition of the purified $SiHCl_3$ in the presence of $H_2$ on silicon bars to give high-purity silicon. The $SiCl_4$-containing reaction gas generated during the thermal decomposition of $SiHCl_3$ is condensed and purified. It is a drawback of this method that large quantities of $SiCl_4$ are produced as a by-product which either reacts in a separate, technically and energetically very expensive process step to give $SiHCl_3$ or has to be utilised, for example in the production of pyrogenic silicic acid.

Reaction of silicon tetrafluoride ($SiF_4$) with sodium-aluminium hydride ($NaAlH_4$) to give $SiH_4$ and sodium-aluminium fluoride ($NaAlF_4$), purification of the resultant $SiH_4$, separation of high-purity silicon on silicon seed particles in a fluid bed, and removal of $H_2$ from the generated granulated high-purity silicon. Large quantities of $NaAlF_4$ are produced which have to be utilised or sold. Another drawback of this method is that during the separation of high-purity silicon in the fluid bed a considerable amount of high-purity silicon powder is produced which has to be disposed of as there is no way of economic utilisation.

Reaction of metallic silicon with $SiCl_4$ and $H_2$ in a fluid bed to give $SiHCl_3$, catalysed 2-stage disproportionation of $SiHCl_3$ to give $SiCl_4$ and $SiH_4$, feedback of the generated $SiCl_4$ into the reaction of metallic silicon with $SiCl_4$ and $H_2$, thermal decomposition of the generated $SiH_4$ on silicon bars to give high-purity silicon and feedback of the $H_2$ generated during this process into the reaction of metallic silicon with $SiCl_4$ and $H_2$.

The last of the methods described above is characterised by the fact that a forced generation of large quantities of by-products is avoided due to the utilisation of $SiCl_4$ generated during the process in the production of $SiHCl_3$, i.e. by reacting it with metallic silicon and hydrogen.

Embodiments of this method are described in "Studies in Organic Chemistry 49, Catalyzed Direct Reactions of Silicon, Elsevier, 1993, pp. 450 through 457" and DE 3 311 650 C2 and CA-A-1 162 028. According to these documents, the production of high-purity silicon following this method comprises the following steps:

1. Reaction of metallic silicon with $SiCl_4$ and $H_2$ at 400 to 600° C. and a pressure of 20.7 to 41.4 bar in a fluid bed reactor.
2. Removal of impurities such as non-reacted fine-grain silicon, metal chlorides and catalyst, if applicable, from the generated chlorosilane-containing and hydrogen-containing reaction mixture by scrubbing the hot gas stream with condensed chlorosilanes.
3. Disposal of the solid-containing chlorosilane suspension thus generated.
4. Condensation of the purified reaction mixture.
5. Feedback of the hydrogen generated in step 4 to step 1.
6. Distillative separation of the purified reaction mixture to give $SiCl_4$ and $SiHCl_3$.
7. Feedback of $SiCl_4$ to step 1.
8. 2-stage catalysed disproportionation of $SiHCl_3$ generated in step 6 to give $SiH_4$ and $SiCl_4$.
9. Feedback of $SiCl_4$ to step 1.
10. Distillative purification of $SiH_4$ generated in step 8.
11. Thermal decomposition of the purified $SiH_4$ while generating high-purity silicon and hydrogen.
12. Utilisation of the hydrogen thus generated as thinning gas in step 11 or feedback to step 1.

During the execution of step 1, the yields obtained fall significantly short of the yields to be expected in the light of the thermodynamic equilibrium due to the slow reaction speed. In order to accelerate the reaction, DE 3 311 650 C2 and DE 4 104 422 A1 suggest the use of copper catalysts. The copper catalysts are usually fed into the fluid bed together with the ground silicon or separately. The drawback of this method is that in the fluid bed a portion of the catalyst is directly discharged from the fluid bed together with the gaseous reactants and/or the reaction products due to insufficient adhesion to the silicon particles and thus is no longer available for the reaction. This causes a considerable need of copper catalyst adversely affecting the economic efficiency of this method with a view to the normally high price of copper catalysts.

During the reaction of metallic silicon with $SiCl_4$ and hydrogen, chlorides such as aluminium chloride ($AlCl_3$), iron chloride ($FeCl_2$) and calcium chloride ($CaCl_2$) are generated in addition to the desired chlorosilanes. Most of these metal chlorides are removed as crystallised solid particles in step 2 by scrubbing the hot gas stream with condensed chlorosilanes. Due to the high sublimation pressure, crystallised $AlCl_3$ may, however, be distributed via the gas chamber in the entire scrubbing facility. This causes deposition of $AlCl_3$ on the scrubbing facility and its internal components so that periodic shutdowns and cleaning measures of the scrubbing facility are required.

The removal of $AlCl_3$ by distilling the chlorosilanes can be performed at lowered temperatures in a vacuum. Under these conditions, the vapour pressure of the solid aluminium chloride is so low that its share in the gaseous phase may fall below the solubility limit so that the problem of deposition of solid aluminium chloride in the facility is avoided. However, it is not possible to lower the $AlCl_3$ portion below the share of its vapour pressure in the entire vapour pressure so that on the one hand the separation of $AlCl_3$ is possible only to a limited degree while on the other hand due to this fact the problem of aluminium chloride deposition during another distillation process occurs anew, although at lesser quantities. The method described in DE 2 161 641 A1 offers a partial solution of this problem wherein the gas stream leaving the synthesis reactor is cooled in two stages by firstly feeding $SiCl_4$ to reach 250 to 300° C. and secondly by using a Venturi scrubber with more $SiCl_4$ to reach approx. 53° C., wherein iron chloride and aluminium chloride carried by the chlorosilanes are deposited and remain in the condensation product while the gas stream containing the major portion of the chlorosilanes is again scrubbed with condensed chlorosilanes so that it can be condensed thereafter. The remaining content of $AlCl_3$ is then determined by the vapour pressure of $AlCl_3$ at approx. 53° C. During the further purification of the chlorosilanes, the aforementioned problem of $AlCl_3$ concentration in the sump occurs again, causing the formation of a solid phase of $AlCl_3$ and its undesired sublimation. Quite similarly, the method described in DE 2 623 290 A1 offers only a partial solution wherein the gas stream containing the chlorosilanes and $AlCl_3$ is cooled down to 60 to 80° C. with the purpose of letting the solid $AlCl_3$ deposit and separating it.

The removal of the metallic silicon and metallic chloride-containing chlorosilane suspension generated in step 2 is performed in accordance with DE 3 709 577 A1 by a specific distillative separation of the chlorosilanes from the solid particles wherein a large portion of the chlorosilanes can be recovered. The remaining solid and chlorosilane-containing distillation sump cannot be utilised and thus has to be disposed of as described for example in U.S. Pat. No. 4,690,810. This process has an adverse effect on the economy of this method. Another drawback is the fact that disturbing impurities are, together with the recovered chlorosilanes, fed back into the process of producing high-purity silicon which may cause an undesired concentration of these impurities and hence adversely affect the process.

During the steps 4, 6, 8 and 10, silane and chlorosilane-containing waste streams are generated which, as a rule, are disposed of by scrubbing with solutions of alkali compounds or, for example, by combustion. Several variants of the method for disposing of the waste streams are for example described in U.S. Pat. No. 4,519,999. In these methods, the reactive silicon compounds are made harmless by converting them into silicates or silicic acids. However, the drawback of this method is that the actually valuable waste stream components such as $SiH_4$, $SiH_2Cl_2$, $SiHCl_3$ and $SiCl_4$ are converted into less valuable products.

The 2-stage catalysed disproportionation of $SiHCl_3$ to give $SiH_4$ and $SiCl_4$ performed in step 8 requires very expensive equipment and power. According to DE 2 507 864 A1, an improved variant of the method is to have the disproportionation of $SiHCl_3$ take place in a single step following the principle of reactive distillation. There is, however, a grave disadvantage in this method described in DE 2 507 864 A1, namely, that the amount of energy used for the separation of the silanes or chlorosilanes has to be completely discharged on a very low temperature level of less than −50° C. to −120° C. corresponding to the condensation temperatures. It is known that heat discharge on a low temperature level is expensive and implies high power consumption.

The thermal decomposition of purified $SiH_4$ of step 11 may be performed following three different methods according to DE 3 311 650 C2:

A. Semi-continuous deposition of high-purity silicon on silicon bars, known as Siemens method.

B. Continuous decomposition of $SiH_4$ in a gaseous phase reactor including the generation of powder-like high-purity silicon.

C. Continuous decomposition of $SiH_4$ on silicon seed particles in a fluid bed including the generation of granulated high-purity silicon.

The method variant A requires very expensive equipment and, due to the inevitable semi-continuous operation, regular plant shutdowns with expensive cleaning work. In the method variant B, high-purity silicon is generated as a fine powder which cannot be directly utilised, so that this powder has to be compressed and molten in expensive subsequent steps. Further, this high-purity silicon powder is easily contaminated due to its very large specific surface and therefore can normally not be utilised in the fields of photovoltaics or semiconductor technology.

In the method variant C, however, granulated high purity-silicon is continuously produced which can easily be processed further. Variants of this method are described, for example, in U.S. Pat. No. 3,012,861 and U.S. Pat. No. 5,798,137. According to these documents, the drawbacks of the method variant C are that a considerable portion of the $SiH_4$ used is decomposed to powder-like high-purity silicon. In order to lessen the powder production, $SiH_4$ decomposition may be performed by adding hydrogen at nearly ambient pressure.

The high-purity silicon powder is, as described above, easily contaminated due to its very large specific surface when it is further processed in subsequent steps and therefore cannot be utilised in the fields of photovoltaics or semiconductor technology, either.

The drawbacks mentioned above are the reason why the production of high-purity silicon is still very expensive so that in particular the economic profitability and with it the growth of photovoltaic applications using high-purity silicon are considerably affected.

It is therefore the object of the present invention to provide a method for producing high-purity silicon which does not imply the drawbacks mentioned above and allows a cost-effective production.

The present invention relates to the production of high-purity silicon, characterised by the following steps:

a) reaction of metallic silicon with silicon tetrachloride ($SiCl_4$), hydrogen ($H_2$) and hydrochloric acid (HCl) at a temperature of 500 to 800° C. and a pressure of 25 to 40 bar to give a trichlorosilane-containing ($SiHCl_3$) feed gas stream, b) removal of impurities from the resultant trichlorosilane-containing feed gas stream by scrubbing with condensed chlorosilanes at a pressure of 25 to 40 bar and a temperature from 160 to 220° C. in a multi-stage distillation column, to give a purified trichlorosilane-containing feed gas stream and a solid-containing chlorosilane suspension, and distillative separation of the purified feed gas stream into a partial stream essentially consisting of $SiCl_4$ and a partial stream essentially consisting of $SiHCl_3$, c) disproportionation of the $SiHCl_3$-containing partial stream to give $SiCl_4$ and $SiH_4$, whereby disproportionation is carried out in several reactive/distillative reaction zones, with a counter-current of vapour and liquid, on catalytically active solids at a pressure of 500 mbar to 50 bar and $SiHCl_3$ is introduced into a first reaction zone, the lower-boiling $SiH_4$-containing disproportionation product produced there undergoes an intermediate condensation in a temperature range of −25 to 50° C., the non-condensed $SiH_4$-containing product mixture is fed to one or more further reactive/distillative reaction zones and the lower boiling point product thus generated, containing a high proportion of $SiH_4$ is completely or partially condensed in the top condenser, and d) thermal decomposition of $SiH_4$ to give high-purity silicon.

Here, high-purity silicon means silicon having a purity high enough to be suitable in the field of photovoltaics. This requires all metal concentrations to remain below 0.1 ppm, carbon content below 1 ppm, oxygen below 5 ppm, phosphorus below 0.1 ppm, and boron below 0.05 ppm.

Metallic silicon means silicon which may contain up to approximately 3 wt. % iron, 0.75 wt. % aluminium, 0.5 wt.

% calcium, and other impurities as being usually found in silicon and which was preferably obtained by carbo-thermic reduction of silicon dioxide.

It was found that the execution of the method according to the present invention brings about a number of advantages allowing a significantly more cost-effective production of high-purity silicon.

In the reaction of metallic silicon with $SiCl_4$, $H_2$ and HCl at a temperature of 500 to 800° C., preferably 550 to 650° C., and a pressure of 25 to 40 bar, preferably 30 to 38 bar, high space/time yields of $SiHCl_3$ are obtained.

The addition of hydrochloric acid, preferably at an amount of 0.05 to 10 wt. %, most preferably 1 to 3 wt. %, each being relative to the amount of $SiCl_4$ added as additional reactant, causes an unexpected acceleration of the reaction which finally leads to the fact that very large $SiHCl_3$ yields, i.e. high reaction levels of the $SiCl_4$ used near the thermodynamic equilibrium, and at the same time high total yields, i.e. large-scale utilisation of the metallic silicon used, are achieved.

Hydrochloric acid is preferably used in its water-free form as hydrochloric gas.

Hydrochloric acid can, for example, be separately fed into the reactor in which the reaction to produce chlorosilane is to be performed. However, it is also possible to feed hydrochloric acid together with the gaseous and/or evaporable initial substances to be fed into the reactor, namely hydrogen and/or silicon tetrachloride.

The selection of the reactor in which the reaction according to the present invention is to be performed is not critical as long as the reactor ensures enough stability with respect to the reaction conditions and allows the contact of the initial substances. Applicable reactors are, for example, a solid bed reactor, a rotating tube furnace or a fluid bed reactor. Preferably the reaction is performed in a fluid bed reactor.

The material of the reactor has to withstand the reaction conditions mentioned with respect to $SiHCl_3$ synthesis. The requirements regarding the durability of the structural reactor materials are applicable as well to possible up- or downstream facility components such as cyclones or heat exchangers. These requirements are met, for example, by nickel-based alloys.

The use of catalysts allows an additional acceleration of the reaction of metallic silicon with $SiCl_4$, $H_2$ and HCl. Especially suitable catalysts are copper, iron, copper or iron compounds or mixtures thereof.

Surprisingly, it became evident that the catalysts were particularly effective when the metallic silicon was grounded and thoroughly mixed with the catalysts prior to the reaction.

In the method according to the present invention, the reaction to give trichlorosilane (step a)) is preferably performed in the presence of a catalyst, wherein the metallic silicon is thoroughly mixed with the catalyst prior to the reaction.

Preferably, silicon having mean grain diameters between 10 and 1000 μm, preferably 100 to 600 μm, is used. The mean grain diameter is determined as the numerical average of the values obtained in a sieving analysis of the silicon.

For mixing the catalyst and the silicon, devices are preferably used which ensure very thorough mixing. Mixers having rotating mix tools are most suitable for this purpose. Such mixers are described, for example, in "Ullmann's Encyclopedia of Industrial Chemistry, Volume B2, Unit Operations 1, pp. 27-1 to 27-16, VCH Verlagsgesellschaft, Weinheim". Most preferably, ploughshare mixers are used.

During the thorough mixing, the catalyst may be crushed further so as to ensure during the mixing process a very good distribution and a very good adhesion of the catalyst to the silicon surface. Thus, even catalysts which are not available as fine particles and/or cannot be crushed to the fineness required may be used.

In case of insufficient mixing, a major portion of the catalyst is, due to its low adhesion to the silicon particles, directly discharged from the fluid bed together with the gaseous reactants and/or products and thus is no longer available for the reaction. This raises the need for catalyst and adversely affects the profitability of the method. This is prevented by thoroughly mixing the silicon and the catalyst.

The time period for mixing the silicon and the catalyst is preferably 1 to 60 minutes. Longer mixing times are normally unnecessary. Mixing times of 5 to 20 minutes are particularly preferred.

The thorough mixing of the catalyst and the silicon may be performed, for example, in an inert atmosphere or in the presence of hydrogen or other gases having a reducing effect such as carbon monoxide. Among other effects, this prevents the formation of an oxidic layer on the individual silicon particles. Such a layer prevents the direct contact between the catalyst and the silicon and thus impairs the catalysed reaction of the latter with silicon tetrachloride, hydrogen and, if applicable, hydrochloric acid to give trichlorosilane.

An inert atmosphere may for example be generated by adding an inert gas during the mixing process. Suitable inert gases include for example nitrogen and/or argon.

The mixing of silicon and catalyst is preferably performed in the presence of hydrogen.

In principle, any catalyst known for the reaction of silicon with silicon tetrachloride, hydrogen and, if applicable, hydrochloric acid may be used.

Particularly suitable catalysts are copper catalysts and iron catalysts. Examples include copper oxide catalysts (e.g. Cuprokat® of Messrs. Norddeutsche Affinerie), copper chloride (CuCl, $CuCl_2$), copper metal, iron oxides (e.g. $Fe_2O_3$, $Fe_3O_4$), iron chlorides ($FeCl_2$, $FeCl_3$) and mixtures thereof.

Preferred catalysts are copper oxide catalysts and iron oxide catalysts.

Especially during the use of copper oxide catalysts and iron oxide catalysts, it has proven to be advantageous to perform the mixing with silicon at a temperature of 100 to 400° C., preferably 130 to 350° C. When doing so, remaining moisture adhering to the catalysts are removed which adversely affects the reaction of silicon with $SiCl_4$, $H_2$ and, if applicable, HCl. Moreover, this approach ensures a better adhesion of the catalyst to the silicon surface thus largely avoiding loss of catalyst in the fluid bed.

It is also possible to use mixtures of copper and/or iron catalysts with other catalytically active components. Such catalytically active components include, for example, metal halogenides such as chlorides, bromides or iodides of aluminium, vanadium or antimony.

The quantity of catalyst used, calculated as metal, is preferably 0.5 to 10 wt. %, most preferably 1 to 5 wt. % relative to the quantity of silicon used.

As an alternative, the method according to the present invention allows in the reaction to give trichlorosilane (step a)) also metallic silicon having an iron content of 1 to 10 wt. %, preferably 1 to 5 wt. % to be used, wherein the iron is mostly homogeneously distributed in the metallic silicon, preferably in the form of a silicide.

Silicon containing homogeneously distributed iron may for example be produced by melting a mixture of silicon and the desired quantity of iron or by adding a desired quantity of iron to a silicon melt, followed by rapid cooling of the melt. Preferably, the addition of the desired quantity of iron is performed as early as during the production of the silicon.

The rapid cooling of the melt may be performed, for example, by jetting the melt in air or by water granulation.

The preferred method for rapid cooling of a silicon melt and thus for producing usable silicon is water granulation. During the water granulation, liquid silicon is fed into water. This causes the silicon to cool down at extreme speed. Depending upon the process parameters, it is possible for example to obtain silicon pellets. Water granulation of silicon is known for example from EP 522 844 A2.

Then the iron is present in the silicon in fine particles being homogeneously distributed.

The mol ratio of hydrogen and silicon tetrachloride may be, for example, 0.25:1 to 4:1 in step a) of the method according to the present invention. The preferred mol ratio is 0.6:1 to 2:1.

According to the present invention, the trichlorosilane-containing feed gas stream generated in the reaction of metallic silicon with $SiCl_4$, $H_2$ and HCl (step a)) is purified by scrubbing with condensed chlorosilanes at a pressure of 25 to 40 bar, preferably 35 to 40 bar, and a temperature of 160 to 220° C., preferably 190 to 200° C., in a multi-stage distillation column (step b)).

Suitable condensed chlorosilanes include, for example, a condensed gas stream comprising trichlorosilane and silicon tetrachloride at a mol ratio of approximately 1:3 to 1:20.

Surprisingly, it became evident that, when the aforementioned temperature and pressure ranges are observed, the silicon powder remnants and metal chlorides, especially $AlCl_3$, which may be contained in the trichlorosilane-containing feed gas stream are completely separated from the feed gas stream and can be removed with the condensed chlorosilanes from the scrubbing column as solids or as dissolved metal chloride (e.g. $AlCl_3$).

The problems described above which are caused by sublimation of $AlCl_3$ in the scrubbing column are surely avoided in the approach according to the present invention. This ensures a faultless long-term operation of the scrubbing column and thus the entire process. Any substances still present having a higher boiling point such as disilanes, polysilanes, siloxanes and hydrocarbons are removed from the feed gas stream together with the condensed chlorosilanes.

A chlorosilane suspension is produced which can then be relaxed and cooled down wherein dissolved metal chlorides, especially $AlCl_3$, fall out almost completely except a few ppm.

Following relaxation and cooling, solids are preferably removed from the chlorosilane suspension by filtration. The solid-free chlorosilanes may be transferred to utilisation while treating the separated solids with alkali compounds.

The filtration of the chlorosilane suspension is preferably performed using sinter metal filter substances. Such filters are known and described, for example, in "Ullmanns Encyklopädie der technischen Chemie, $4^{th}$ edition, Vol. 19, p. 573, Verlag Chemie, 1980".

The solid-free filtrate is an extremely suitable raw material for the production of pyrogenic silicic acid. Further processing, for example, by distillation, is not required. The solids produced during filtration may be made inert in a known manner using alkali compounds such as soda lye, $Na_2CO_3$, $NaHCO_3$ and CaO and used after inertisation as raw material for cement production.

In an advantageous variant of the method according to the present invention, the trichlorosilane-containing feed gas is made free from any existing powder-like solids by gas filtration prior to scrubbing with condensed chlorosilanes. This can for example be performed in cyclones, wherein several cyclones connected in series and/or one or more multi-cyclones can be used to achieve high separation levels. As an alternative, hot-gas filters with sinter metal or ceramic candles or combinations of cyclones and hot-gas filters may be used. This approach has the advantage that the subsequent feed gas scrubbing is significantly facilitated while a silicon metal-containing solid is obtained which, due to its high content of silicon, can be transferred to utilisation in metallurgical processes such as the production of iron alloys. For this purpose, the silicon metal and metal chloride-containing solid may for example react with alkali compounds such as soda lye, $Na_2CO_3$, $NaHCO_3$ and CaO and water, be filtrated and washed with water to remove chloride and then be dried, if required.

The now purified feed gas stream is condensed in a known manner and separated by preferably multi-stage distillation into a partial stream mainly consisting of $SiCl_4$ and a partial stream mainly consisting of $SiHCl_3$.

Preferably, the partial stream mainly containing $SiCl_4$ is fed back into the reaction of metallic silicon with silicon tetrachloride, $H_2$ and HCl (step a)).

Distillation may be performed at a pressure of 1 to 40 bar. Preferably distillation is performed at a pressure of less than 10 bar in order to achieve a good separation of $SiCl_4$ and $SiHCl_3$ with a minimum of distillation stages.

According to the present invention, the $SiHCl_3$-containing partial stream is fed to a subsequent disproportionation. It has been proven as advantageous to remove most of the components which have a lower boiling point than $SiHCl_3$ from this partial stream in a multi-stage distillation process. This distillation may also be performed at a pressure of 1 to 40 bar. Preferably, the distillation is performed at a pressure of less than 10 bar in order to achieve a good separation of compounds having a lower boiling point from $SiHCl_3$ with a minimum of distillation stages.

In another advantageous variant, the purified $SiHCl_3$ is subsequently made free from anhydric acids such as halogenides and hydrides using caustic solids. Examples of anhydric acids include $BCl_3$, $BH_3$, $PCl_3$, HCl. The advantage is that the efficiency of the subsequent catalysed disproportionation is not adversely affected so that a long-term faultless operation of the disproportionation process is ensured. The caustic solids used may be identical with the disproportionation catalysts used in the following step.

The contact with caustic solids may be performed, for example, in a solid bed reactor. The process is preferably performed at a pressure of 1 to 50 bar, most preferably 1 to 10 bar. The temperatures may for example be in the range from 30 to 180° C., preferably 50 to 110° C. The temperature to be set depends upon the stability range of the caustic solids used. In order to ensure continuous operation, two or more reactors provided with caustic solids can be connected in parallel. It is possible to regularly switch over to a reactor filled with fresh solids to ensure a complete removal of the aforementioned impurities while the consumed solids are exchanged and regenerated, if required. Similarly, a reactor can be operated as several reactors connected in series.

The disproportionation of the purified, if required, trichlorosilane-containing partial stream (step c)) is most preferably performed in a column at a pressure of 1 to 10 bar, wherein said column comprises at least two reactive/distillative reaction zones.

Disproportionation takes place on catalytically active solids, preferably in catalyst beds each comprising a bulk solid layer consisting of solid pieces working as catalyst solids, wherein the disproportionation products are able to flow through this layer. In the reaction zone, the bulk solid layer may be replaced by packed catalyst bodies.

Suitable catalytically active solids are known and described, for example, in DE 2 507 864 A1. Such suitable solids are, for example, solids which carry amino or alkyleneamino groups on a polystyrene structure meshed with divinyl benzene. Amino or alkyleneamino groups include for example: dimethylamino, diethylamino, ethylmethylamino, di-n-propylamino, di-iso-propylamino, di-2-chloroethylamino, di-2-chloropropylamino groups as well as the similarly substituted dialkylaminomethylene groups and the corresponding hydrochlorides or the trialkylammonia groups derived therefrom by methylisation, ethylisation, propylisation, butylisation, hydroxyethylisation or benzylisation with chloride as counter-ion. Of course, in the case of quaternary ammonia salts or protonised ammonia salts, catalytically active solids having other anions, e.g. hydroxyde, sulphate, hydrogen sulphate, bicarbonate and the like, may be fed into the method according to the present invention, although a gradual conversion into the chloride form is inevitable under the reaction conditions, which applies to organic hydroxy groups as well. Therefore, ammonia salts containing chloride as counter-ion are preferred.

Other suitable catalytically active solids include, for example, solids consisting of a polyacrylic acid structure, especially a polyacrylamide structure, which has bonded trialkylbenzyl ammonia, for example, via an alkyl group.

Another suitable group of catalytically active solids includes, for example, solids having bonded sulphonate groups to a polystyrene structure, meshed with divinyl benzene, being confronted by tertiary or quaternary ammonia groups as kations.

As a rule, macroporous or mesoporous exchanger resins are more suitable than gel resins.

The trichlorosilane-containing partial stream of step b) is fed to the reaction column through an inlet opening into the column at an appropriate point. Such an appropriate point is, for example, a point at which the column has an inner temperature corresponding to the boiling point of trichlorosilane at the existing pressure. In the reaction zones, a $SiH_4$-containing, vapour-like product mixture ascending in the reaction zone and a $SiCl_4$-containing liquid mixture descending in the reaction zone are formed by disproportionation of $SiHCl_3$.

The $SiCl_4$-containing liquid flowing out of the reaction zone is fed inside the reaction column into a distillative depression unit beneath the reactive/distillative zone from which unit silicon tetrachloride $SiCl_4$ may flow off as sump product.

For the $SiH_4$-containing product mixture ascending in the reaction zone, an intermediate condenser is provided above the reaction zone in which condenser the concentration of $SiH_4$ in the product mixture is increased by partial condensation of components having a higher boiling point at a temperature between −25° C. and 50° C., preferably between −5° C. and 40° C. The product components having a lower boiling point which were not condensed in the intermediate condenser are supplied for a further concentration increase to a second reactive/distillative reaction zone downstream the intermediate condenser in the flow direction of the ascending product components and then to a booster unit.

Preferably, disproportionation is performed so that several intermediate condensation processes take place in the reaction zones as a whole on different temperature levels ranging from −25° C. to 50° C.

The use of three or more reactive/distillative reaction zones and two or more intermediate condensers allows the discharge of the intermediate condensation heat at different temperature levels with low driving temperature differences with advantageously low power consumption.

The booster unit may be arranged inside or outside the reaction column. The product mixture leaving the booster unit is finally supplied to a top condenser where it is deposited and discharged. A portion of the product mixture may be fed back to the top of the reaction column.

Impurities depositing at different temperature levels in the reaction column may be taken out of the column via lateral removal points.

In order to further lower the condensation energy to be discharged at a very low temperature, the feedback quantity can be decreased and a top product be generated having a lesser silane purity of between 25% and 90%. This top product may then be separated to be further purified in a downstream separation column wherein an equal or preferably higher pressure than in the reaction column, preferably 15 bar to 100 bar, is set so that the separation column operates at higher temperatures than the reaction column with respect to an equal composition. The sump product of the separation column may, depending upon the selected operating conditions, contain large quantities of trichlorosilane, dichlorosilane and monochlorosilane. The sump product may entirely or partly be fed back into the reaction column. Impurities may, if required, be removed from the system by sluicing out a partial stream.

Preferably, $SiCl_4$ obtained during disproportionation is fed back into the reaction of silicon with $SiCl_4$, $H_2$ and HCl (step a)).

According to the present invention, $SiH_4$ obtained during disproportionation is thermally decomposed (step d)).

It is possible to subject $SiH_4$ obtained during disproportionation to a distillative purification prior to its thermal decomposition.

In a particularly preferred embodiment of the method according to the present invention, the thermal decomposition of $SiH_4$ which has been purified by distillation, if required, is performed on high-purity silicon seed particles in a fluid bed at a pressure of 100 to 900 mbar.

Thermal decomposition is preferably performed at pressures from 200 to 800 mbar. The pressure range between 300 and 700 mbar, most preferably between 400 and 600 mbar, is particularly preferred. All specified pressure values are absolute pressure values. The aforementioned pressure means the pressure existing behind the fluid bed as viewed in the flow direction of the gas stream supplied.

In the thermal decomposition of silane, it is possible to add up to 50 vol. % of a silicon-free gas with relation to the entire gas supplied. Preferably, the added quantity of silicon-free gas is 0 to 40 vol. %, most preferably 0 to 20 vol. %. The addition of silicon-free gas reduces the formation of silicon powder.

Suitable silicon-free gases include, for example, the rare gases, nitrogen and hydrogen, wherein the silicon-free gases may be used individually or in any combination thereof. Nitrogen and hydrogen are preferred, with hydrogen being preferred most.

The advantageous temperature range for the thermal decomposition of silane is between 500° C. and 1400° C. A decomposition temperature of 600° C. to 1000° C. is preferred, with 620° C. to 700° C. being preferred most.

The high-purity silicon seed particles may be fed into the reaction chamber of a fluid bed reactor. The high-purity silicon seed particles may be fed from outside intermittently or continuously. However, particles being generated in the reaction chamber may be used as high-purity silicon seed particles as well. The high-purity seed particles form a solid bed through which the supplied gas is blown in. The blow-in speed of the supplied gas is set so that the solid bed is fluidised and a fluid bed is formed. The relevant approach as such is known to a person skilled in the art. The blow-in speed of the supplied gas has to be at least equal to the loosening speed. Loosening speed means the speed at which a gas flows through a particle bed and below which the solid bed is retained, i.e. below which the bed particles remain mostly immobile. Above this speed, fluidisation of the bed starts, i.e. the bed particles move, and initial bubbles are formed.

In this embodiment, the blow-in speed of the supplied gas is one to ten times, preferably one-and-a-half to seven times, the loosening speed.

The high-purity seed particles being advantageously used have diameters between 50 and 5000 µm.

The high-purity seed particles may, for example, be generated by crushing the granulated high-purity silicon generated during thermal decomposition of $SiH_4$ in the fluid bed. Usual crushing methods such as grinding imply the risk that the high-purity silicon seed particles are contaminated during the crushing process.

Therefore, the production of the high-purity silicon seed particles is preferably performed by their generation in the decomposition reactor itself, separation of a fraction of appropriate particle size by process-internal inspection and their feedback into the reactor.

The hydrogen generated during thermal decomposition of silane is preferably fed back into the reaction of silicon with $SiCl_4$, $H_2$ and HCl (step a)).

In another preferred variant, the high-purity silicon powder generated as a by-product during thermal decomposition of $SiH_4$ is, following its separation from the granulated high-purity silicon, in a separate process step heated up my microwave irradiation at wavelengths between 0.5 kHz and 300 GHz to a temperature of at least 300° C. and agglomerated. By doing so, a product is obtained which, without any further processing steps such as condensation and crushing, may for example be introduced into the melting process for the production of silicon wafers for solar cells.

Another preferred embodiment of the method according to the present invention suggests that $SiH_4$ and $SiH_2Cl_2$-containing waste streams of the various distillation processes are collected to react with $SiCl_4$ to give a $SiHCl_3$-containing reaction mixture from which $SiHCl_3$ is obtained by distillation. It is advantageous to use in this reaction liquid disproportionation catalysts having a boiling point above the boiling point of $SiCl_4$. Suitable disproportionation catalysts include, for example, trialkylamines and aryl-dialkylamines.

If desired, $SiHCl_3$ may be used in the disproportionation process (step c) following further purification. Thus, the yield and the profitability of the entire process are improved because there is no need for a disposal of the aforementioned waste streams which causes a loss of silicon compounds.

The high-purity silicon obtained according to the present invention may, due to its high purity level, be easily utilised as raw material for the production of semiconductors and solar cells.

The method according to the present invention allows a very cost-effective production of high-purity silicon due to the utilisation of the waste streams and by-products becoming possible according to the present invention, higher yields from the $SiHCl_3$ synthesis, and the considerable lower overall power need.

What is claimed is:

1. A method for producing high-purity silicon, characterized by the following steps:
    a) reaction of metallic silicon with silicon tetrachloride ($SiCl_4$), hydrogen ($H_2$ and hydrochloric acid (HCl) at a temperature of 500 to 800° C. and a pressure of 25 to 40 bar to give a trichlorosilane-containing ($SiHCl_3$) feed gas stream,
    b) removal of impurities from the resultant of trichlorosilane containing feed gas stream by scrubbing with condensed chlorosilanes at a pressure of 25 to 40 bar and a temperature from 160 to 220° C. in a multi-stage distillation column, to give a purified trchlorosilane containing feed gas stream and a solid containing chlorosilane suspension, and distillative separation of the purified feed gas stream into a partial stream essentially comprising $SiCl_4$ and a partial stream essentially comprising $SiHCl_3$,
    c) disproportionation of the $SiHCl_3$-containing partial stream to give $SiCl_4$ and $SiH_4$, whereby the disproportionation is carried out in several reactive/distillative reaction zones, with a counter-current of vapor and liquid, on catalytically active solids at a pressure of 500 mbar to 50 bar and $SiHCl_3$, is introduced into a first reaction zone, the lower-boiling $SiH_4$-containing disproportionation product produced there undergoes an intermediate condensation in a temperature range of −25 to 50° C., the non-condensed $SiH_4$-containing product mixture is fed to one or more further reactive/distillative reaction zones and the lower boiling point product thus generated, containing a high proportion of $SiH_4$ is completely or partially condensed in the top condenser, and
    d) thermal decomposition of the $SiH_4$ to give high-purity silicon.

2. A method according to claim 1, characterized in that step a) is performed in a fluid bed reactor.

3. A method according to claim 1, characterized in that hydrochloric acid is introduced at a quantity of 0.05 to 10 wt. % relative to the weight of the supplied $SiCl_4$.

4. A method according to claim 1, characterized in that step a) is performed in the presence of a catalyst wherein said catalyst and the metallic silicon are thoroughly mixed prior to being fed into a reactor.

5. A method according to claim 4, characterized in that at least one of copper, iron, copper compounds, iron compounds and mixtures thereof are used as catalyst.

6. A method according to claim 1, characterized in that metallic silicon having an iron content of 0.5 to 10 wt. % is used, wherein iron is mostly homogeneously distributed among the metallic silicon.

7. A method according to claim 1, characterized in that solid components, if any, of the trichlorosilane-containing feed gas stream are separated prior to scrubbing with condensed chlorosilanes.

8. A method according to claim 1, characterized in that the solid-containing chlorosilane suspension generated in step b) is made free of solids by filtration, the solid-free chlorosilanes are transferred to further utilization, and the solids are treated with alkali compounds.

9. A method according to claim 3, characterized in that filtration is performed using sinter metal filter materials.

10. A method according to claim 1, characterized in that the $SiCl_4$-containing partial stream obtained in step b) is fed back into the reaction of metallic silicon with $SiCl_4$, $H_2$ and HCl (step a)).

11. A method according to claim 1, characterized in that the partial stream consisting mostly of trichlorosilane obtained in step b) is made mostly free from components having a lower boiling point than SiHCl$_3$ prior to disproportionation.

12. A method according to claim 1, characterized in that the partial stream consisting mostly of trichlorosilane obtained in step b) is brought into contact with caustic solids prior to disproportionation for the purpose of removing anhydric acids such as halogenides and hydrides.

13. A method according to claim 1, characterized in that disproportionation of trichlorosilane (step c)) is performed at a pressure between 1 and 10 bar.

14. A method according to claim 1, characterized in that in step c) several intermediate condensation processes at different temperature levels in the range from −25° C. to 50° C. are performed in the reaction zones as a whole.

15. A method according to claim 1, characterized in that SiCl$_4$ obtained in step c) is fed back into the reaction of metallic silicon with SiCl$_4$, H$_2$ and HCl (step a)).

16. A method according to claim 1, characterized in that SiH$_4$ generated in step c) is subjected to a distillative purification prior to its thermal decomposition.

17. A method according to claim 1, characterized in that silane and dichlorosilane-containing waste streams of the distillative steps are collected to react with SiCl$_4$ to give a trichlorosilane-containing reaction mixture, with obtaining SiHCl$_3$ by distillation from said reaction mixture.

18. A method according to claim 17, characterized in that in the reaction of the silane and dichlorosilane-containing waste streams with SiCl$_4$ liquid disproportionation catalysts having a boiling point above the boiling point of SiCl$_4$ are used.

19. A method according to claim 1, characterized in that the thermal decomposition of SiH$_4$ (step d)) on high-purity silicon seed particles is performed in a fluid bed at a pressure of 100 to 900 mbar.

20. A method according to claim 1, characterized in that in the thermal decomposition of SiH$_4$ up to 50 vol. % of a silicon-free gas, relative to the overall quantity of the supplied gas, is added in addition to the SiH$_4$ from step c).

21. A method according to claim 20, characterized in that hydrogen is used as silicon-free gas.

22. A method according to claim 1, characterized in that H$_2$ generated in step d) is fed back into the reaction of metallic silicon with SiCl$_4$, H$_2$ and HCl (step a)).

23. A method according to claim 1, characterized in that in the thermal decomposition of purified SiH$_4$ (step d)) high-purity silicon powder is generated as by-product which is heated up to a temperature of at least 300° C. and agglomerated by means of microwave irradiation in a wavelength range between 0.5 kHz and 300 GHz.

* * * * *